(12) United States Patent
Kim et al.

(10) Patent No.: US 10,629,151 B2
(45) Date of Patent: Apr. 21, 2020

(54) SHIFT REGISTER UNIT, GATE DRIVING CIRCUIT, DISPLAY AND GATE DRIVING METHOD

(71) Applicant: BOE TECHNOLOGY GROUP CO., LTD., Beijing (CN)

(72) Inventors: Jiha Kim, Beijing (CN); Lijun Yuan, Beijing (CN); Zhichong Wang, Beijing (CN); Mingfu Han, Beijing (CN); Xing Yao, Beijing (CN); Guangliang Shang, Beijing (CN); Seung Woo Han, Beijing (CN); Yun Sik Im, Beijing (CN); Jing Lv, Beijing (CN); Yinglong Huang, Beijing (CN); Jung Mok Jun, Beijing (CN); Haoliang Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/066,827

(22) PCT Filed: Dec. 14, 2017

(86) PCT No.: PCT/CN2017/116050
§ 371 (c)(1),
(2) Date: Jun. 28, 2018

(87) PCT Pub. No.: WO2018/209938
PCT Pub. Date: Nov. 22, 2018

(65) Prior Publication Data
US 2019/0279588 A1 Sep. 12, 2019

(30) Foreign Application Priority Data
May 17, 2017 (CN) .......................... 2017 1 0349564

(51) Int. Cl.
*G09G 3/36* (2006.01)
*G11C 19/28* (2006.01)

(52) U.S. Cl.
CPC ............. *G09G 3/3677* (2013.01); *G09G 3/36* (2013.01); *G11C 19/28* (2013.01); *G09G 2300/0426* (2013.01); *G09G 2310/0286* (2013.01); *G09G 2330/021* (2013.01)

(58) Field of Classification Search
CPC ......... G09G 3/3677; G09G 2300/0426; G09G 2310/0286; G09G 2330/021; G11C 19/28
See application file for complete search history.

(56) References Cited

U.S. PATENT DOCUMENTS 9,478,311 B2 10/2016 Shao et al.
10,217,391 B2 2/2019 Shang et al.
(Continued)

FOREIGN PATENT DOCUMENTS

CN 102915698 A 2/2013
CN 103366662 A 10/2013
(Continued)

OTHER PUBLICATIONS

Search Report and Written Opinion dated Mar. 14, 2018 from State Intellectual Property Office of the P.R. China.
First Chinese Office Actino dated Oct. 8, 2019.

*Primary Examiner* — Stephen G Sherman
(74) *Attorney, Agent, or Firm* — Dilworth & Barrese, LLP; Michael J. Musella, Esq.

(57) ABSTRACT

There is provided in the present disclosure a shift register unit, comprising: an input circuit, whose first terminal is connected to a power supply terminal, second terminal is connected to an input terminal, and third terminal is connected to a pull-up node, the input circuit being configured to input a power supply signal input by the power supply terminal to the pull-up node under the control of an input
(Continued)

signal; a pull-up control circuit, whose first terminal is connected to a first clock signal terminal, and second terminal is connected to the pull-up node, the pull-up control circuit being configured to control a potential of the pull-up node according to a first clock signal input by the first clock signal terminal; a pull-up circuit, whose first terminal is connected to a first signal terminal, second terminal is connected to an output terminal, third terminal is connected to the pull-up node.

20 Claims, 15 Drawing Sheets

(56) References Cited

U.S. PATENT DOCUMENTS

2006/0227093 A1* 10/2006 Jang .................. G09G 3/20
 345/100
2014/0092376 A1 4/2014 Xu et al.
2015/0318052 A1 11/2015 Li
2015/0371716 A1* 12/2015 Shao .................. G11C 19/287
 345/100
2017/0193889 A1* 7/2017 Li ............................ G09G 3/20
2017/0221441 A1 8/2017 Gu et al.

FOREIGN PATENT DOCUMENTS

| CN | 103985341 A | 8/2014 |
| CN | 104078017 A | 10/2014 |
| CN | 104715733 A | 6/2015 |
| CN | 105047168 A | 11/2015 |
| CN | 205028636 U | 2/2016 |
| CN | 205070772 U | 3/2016 |
| CN | 105702194 A | 6/2016 |
| CN | 106128347 A | 11/2016 |
| JP | 2008242109 A | 10/2008 |
| KR | 1020080058570 A | 6/2008 |
| KR | 20150003054 A | 1/2015 |

* cited by examiner

SHIFT REGISTER UNIT, GATE DRIVING CIRCUIT, DISPLAY AND GATE DRIVING METHOD

CROSS-REFERENCE TO RELATED APPLICATION

The present application claims the priority of a Chinese patent application No. 201710349564.X filed on May 17, 2017. Herein, the content disclosed by the Chinese patent application is incorporated in full by reference as a part of the present application.

TECHNICAL FIELD

The present disclosure relates to a shift register unit and a gate driving circuit, in particularly relating to a low power consumption shift register and a shift register unit.

BACKGROUND

A gate drive on array (GOA) refers to integration of a gate drive of a liquid crystal display (LCD) on an array substrate. A gate driving circuit comprises a shift register, and transistors applied in the shift register can be for example an a-Si thin film transistor (TFT). A GOA circuit is connected to a gate line of the array substrate and functions as a control gate signal of the shift register.

The GOA in the prior art is composed of a plurality of stages of shift register units, each of which has an output terminal Gout for outputting a driving signal sequentially, to drive each piece of gate line.

However, in the existing shift register unit, since a duty ratio of a CLK signal forming an output signal would cause forming a parasitic current of a TFT, thereby causing increase of power consumption. In order to solve this technical problem, the present disclosure provides a GOA that applies a GOA of a DC holding type to a PU/PD node of the shift register unit so as to minimize the power consumption.

Additionally, in a low power consumption GOA, since the falling time of the output signal is increased, it causes that the reset signal starts resetting when the output of the shift register unit does not occur, thereby causing the problem that sufficient charging cannot be performed.

SUMMARY

Given the above technical problem, there are provided in the present disclosure a shift register unit, a gate driving circuit, a liquid crystal display and a driving method of the gate driving circuit, which are capable of charging the shift register unit sufficiently and are capable of shortening the falling time of the output signal.

According to one aspect of the present disclosure, there is provided a shift register unit, comprising: an input circuit, whose first terminal is connected to a power supply terminal, second terminal is connected to an input terminal, and third terminal is connected to a pull-up node, the input circuit being configured to input a power supply signal input by the power supply terminal to the pull-up node under the control of an input signal; a pull-up control circuit, whose first terminal is connected to a first clock signal terminal and second terminal is connected to the pull-up node, the pull-up control circuit being configured to control a potential of the pull-up node according to a first clock signal input by the first clock signal terminal; a pull-up circuit, whose first terminal is connected to a first signal terminal, second terminal is connected to an output terminal, and third terminal is connected to the pull-up node, the pull-up circuit being configured to pull up a potential of an output signal output by the output terminal under the control of the pull-up node.

According to another aspect of the present disclosure, there is provided a gate driving circuit, comprising a plurality of shift register units connected in cascades, wherein an input terminal of a first stage of shift register unit is connected to a start signal, a first reset terminal of a second stage of shift register unit from the bottom is connected to a first reset signal, a first reset terminal of a last stage of shift register unit is connected to a second reset signal, a second reset terminal of the last stage of shift register unit is connected to a first clock signal of the first stage of shift register unit, and first reset terminals of the first stage of shift register unit to a third stage of shift register unit from the bottom are input output signals of their next of next shift register unit.

According to another aspect of the present disclosure, there is provided a display, comprising an array substrate and the above mentioned gate driving circuit on the array substrate. Signal output terminals of the shift register units are connected to gates of the array substrate.

According to another aspect of the present disclosure, there is provided a gate driving method applicable to the gate driving circuit as described above, comprising: in an input phase, an input signal is input to an input terminal, an input circuit is turned on under the control of the input signal, a power supply signal input by the power supply terminal is input to a pull-up node via the input circuit, and a potential of the pull-up node rises; in a pull-up phase, a pull-up control circuit pulls up the potential of the pull-up node under the control of a first clock signal, and a pull-up circuit is turned on under the control of the pull-up node, to pull up a potential of an output signal of an output terminal; in a first reset phase, a first reset circuit is turned on under the control of a first reset signal, such that the potential of the pull-up node is reset from a high level to a low level.

The gate integrated driving circuit, the shift register unit and the display screen provided in embodiments of the present disclosure are capable of eliminating the problem of starting resetting when the output signal is not output sufficiently by utilizing the output of the next of next stage of gate integrated driving circuit as the reset signal, and are capable of shortening the falling time of the output signal of the shift register unit by utilizing a second reset signal and a third signal lower than the second signal.

BRIEF DESCRIPTION OF THE DRAWINGS

In order to describe technical solutions of embodiments of the present disclosure more clearly, accompanying figures of the embodiments will be introduced briefly. Obviously, the figures described below just relate to some embodiments of the present disclosure, rather than limiting the present disclosure.

DETAILED DESCRIPTION

In order to make purposes, technical solutions and advantages of embodiments of the present disclosure more clearly, the technical solutions of the embodiments of the present disclosure will be described clearly and completely by combining with figures of the embodiments of the present disclosure. Obviously, the embodiments described below are a part of embodiments of the present disclosure, but not all the embodiments. Based on the embodiments of the present disclosure described below, all the other embodiments obtained by those ordinary skilled in the art without paying any inventive labor belong to the scope sought for protection.

Unless otherwise defined, technical terms or scientific terms used herein shall have common meanings understood by those ordinary skilled in the art of the present disclosure. "First", "second" and similar words used in the present disclosure do not represent any sequence, number or importance, but are just used to distinguish different components. Also, similar words such as "comprise" or "include" means that an element or an object prior to the word covers an element or object or equivalents thereof listed subsequent to the word, while other elements or objects are not excluded. Similar words such as "connection" or "connected to" are not limited to physical or mechanical connection, but can comprise electrical connection, regardless of direct connection or indirect connection. "Up", "down", "left", and "right" are just used to indicate relative position relationship. After an absolute position of a described object is changed, its relative position relationship is likely to be changed correspondingly.

Thin film transistors adopted in the embodiments of the present disclosure can be N type transistors, or can be P type transistors. A first electrode of a transistor adopted in the embodiments of the present disclosure can be a source, and a second electrode thereof can be a drain. In the following embodiments, descriptions are provided by taking a thin film transistor being N type transistors as an example, that is, when the signal of the gate is at a high level, the thin film transistor is turned on. It can be conceived that when a P type transistor is adopted, that is, the signal of the gate is at a low level, the thin film transistor is turned on, and it needs to adjust the timing of driving signals correspondingly. Specific details are not given herein, but they also fall into the protection scope of the present disclosure.

Figure 1:
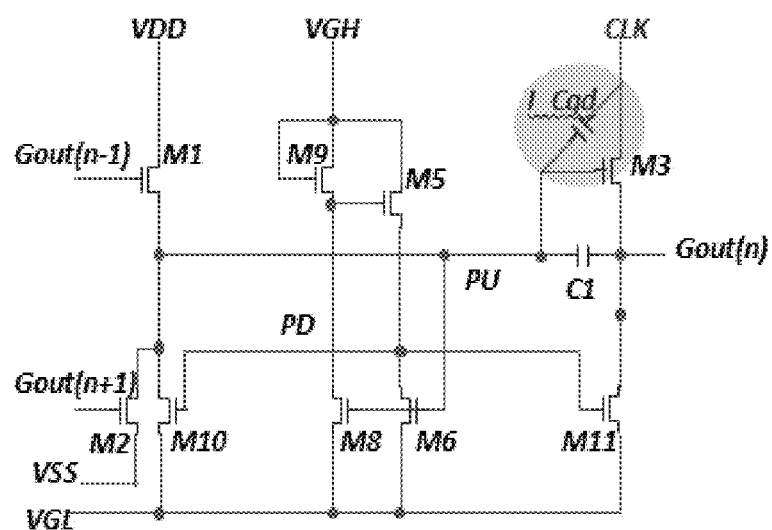
FIG. 1 is a schematic diagram representing a shift register unit of a GOA circuit.
Figure 2:
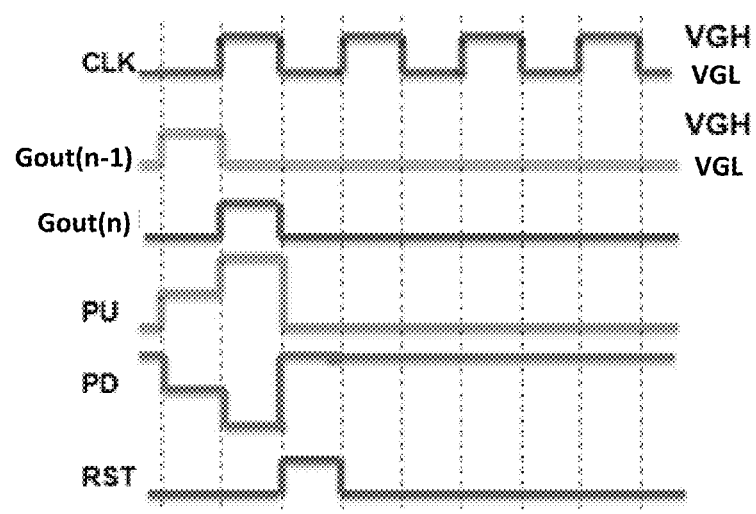
FIG. 2 is a signal sequence diagram of the shift register unit as shown in FIG. 1.

FIG. 1 represents a circuit diagram of a shift register unit in a GOA circuit. FIG. 2 is a timing diagram of the shift register unit as shown in FIG. 1.

As shown in FIGS. 1 and 2, in an input phase, an output signal Gout(n−1) of a previous stage is taken as an input signal of a present stage to be input to an input terminal of a present stage of shift register unit, an input transistor M1 is turned on under the control of the input signal Gout(n−1), and a signal of a power supply terminal VDD is input to a pull-up node PU. Since the potential of the pull-up node PU is pulled up, a transistor M3 is turned on under the control of the pull-up node PU. Since a first clock terminal is not input any signal at this time, the output terminal does not output any signal; in a pull-up phase, the first clock terminal CLK is input a clock signal. Since the M3 is turned on, a clock signal is input to the output terminal Gout(n) via the M3, and the output signal of the present stage of shift register unit is output. Due to the bootstrap effect of the capacitor C1, the potential of the node PU is further pulled up; in a reset phase, a reset terminal is connected to an output terminal of a next stage of shift register unit, and when the next stage of shift register unit outputs a signal Gout(n+1), a reset transistor M2 is turned on under the control of Gout(n+1), so that the potential of the pull-up node PU is pulled down to a low voltage power supply signal VSS. At this time, the potential of the pull-down node PD is pulled up to a high level under the control of the low potential of the pull-up node PU, and controls transistors M11 and M10 to be turned on, so that the output terminal of the present stage of shift register unit is pulled down to a low level.

However, in the shift register unit described above, since a duty ratio of the CLK signal forming an output signal would cause a parasitic current of a TFT (I_Cqd as shown in FIG. 1), thereby causing an increase of the power consumption of the shift register unit.

In order to solve this technical problem, there is provided a GOA that applies a GOA of a DC holding type to the node PU/PD to minimize the power consumption.

Additionally, in the low power consumption GOA, it exists a disadvantage of an increase of the falling time of the output signal.

There is provided in the present disclosure a shift register 1 functioning as a gate driving circuit. The shift register 1 comprises a plurality of stages of shift register units $S_1, S_2, \ldots, S_N$ connected in cascades.

Figure 3:
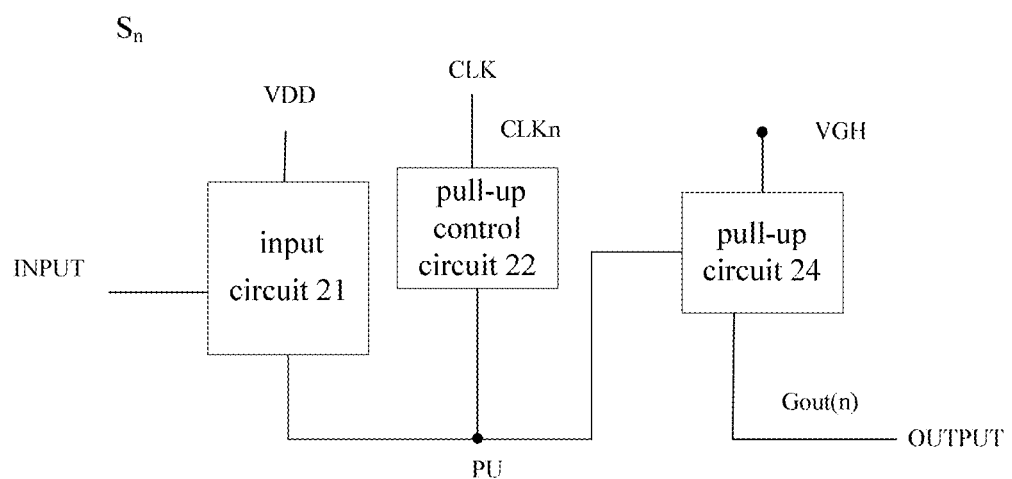
FIG. 3 is a schematic block diagram of a shift register unit according to an embodiment of the present disclosure.

FIG. 3 shows a schematic block diagram of a shift register unit according to an embodiment of the present disclosure. The n-th stage of shift register unit $S_n$ comprises an input circuit 21, whose first terminal is connected to a power supply terminal VDD, second terminal is connected to an input terminal INPUT, and third terminal is connected to a pull-up node PU. The shift register unit $S_n$ further comprises a pull-up control circuit 22, whose first terminal is connected to a first clock signal terminal CLK, and second terminal is connected to the pull-up node PU. The shift register unit $S_n$ further comprises a pull-up circuit 24, whose first terminal is connected to a first signal terminal VGH, second terminal is connected to the pull-up node PU, and third terminal is connected to the output terminal. Herein, the power supply terminal VDD and the first signal terminal VGH are input a high level during operation of the shift register.

In the input phase, when the input terminal INPUT is input an input signal, the input circuit 21 is turned on under the control of the input signal, and the power supply signal VDD is input to the pull-up node PU. At this time, the pull-up circuit 24 is partially turned on under the control of the pull-up node PU. At this time, the output terminal OUTOUT outputs an output signal in a first phase. In the output phase, the first clock signal terminal CLK is input a first clock signal CLKn, and controls to make the potential of the pull-up node PU be further pulled up. At this time, the pull-up circuit 24 is completely turned on, so that a high level signal input by the first signal terminal VGH is output to the output terminal. At this time, the output terminal OUTPUT outputs an output signal in a second phase. In some embodiments, a potential of the output signal in a second phase can be higher than the potential of the output signal in the first phase.

Figure 4:
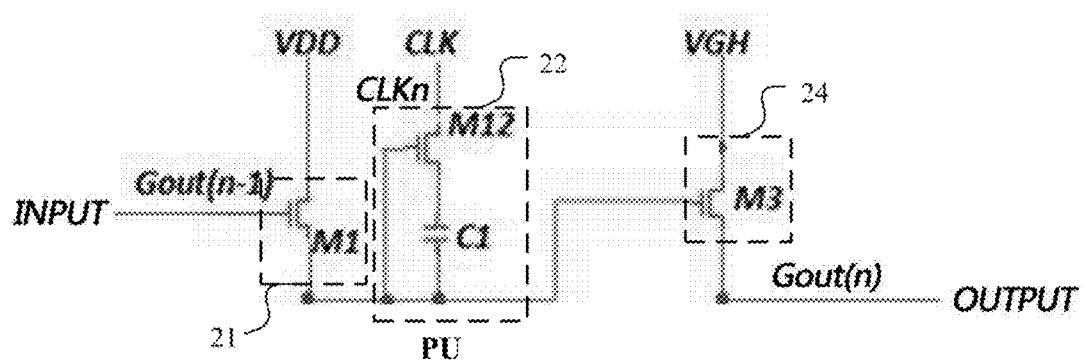
FIG. 4 is a circuit structure diagram of a shift register unit according to an embodiment of the present disclosure.

FIG. 4 shows a circuit structure of a shift register unit according to an embodiment of the present disclosure.

As shown in FIG. 4, the input circuit 21 comprises an input transistor M1. A gate of the input transistor M1 is connected to the input terminal INPUT, a first electrode of the input transistor M1 is connected to the power supply terminal VDD, and a second electrode of the input transistor M1 is connected to the pull-up node PU.

The pull-up control circuit 22 comprises a pull-up control transistor M12 and a pull-up control capacitor C1. A gate of the pull-up control transistor M12 is connected to the pull-up node PU, a first electrode f the pull-up control transistor M12 is connected to the first clock signal terminal CLK, and a second electrode of the pull-up control transistor M12 is connected to a first terminal of the pull-up control capacitor C1. A second terminal of the pull-up control capacitor C1 is connected to the gate of the pull-up control transistor M12 and is connected to the pull-up node PU.

The pull-up circuit 24 comprises a pull-up transistor M3. A gate of the pull-up transistor M3 is connected to the pull-up node PU, a first electrode pull-up transistor M3 is connected to the first signal terminal VGH, and a third electrode pull-up transistor M3 is connected to the output terminal.

In the input phase, when the input terminal INPUT is input the input signal, the input transistor M1 is turned on under the control of the input signal Gout(n−1), and the power supply signal VDD is input to the pull-up node PU. At this time, the pull-up transistor M3 is partially turned on under the control of the pull-up node PU. At this time, the output terminal OUTPUT outputs the output signal in the first phase. In the output phase, the first clock signal terminal CLK is input the first clock signal CLKn, and due to the bootstrap effect of the pull-up control capacitor C1, the potential of the pull-up node PU is further pulled up. At this time, the pull-up transistor M3 is completely turned on, and the high level signal input by the first signal terminal VGH is output to the output terminal. At this time, the output terminal OUTPUT outputs an output signal in the second stage. In some embodiments, the potential of the output signal in the second phase can be higher than a potential of the output signal in the first phase.

It is capable of realizing a lower power consumption GOA circuit by utilizing the shift register according to the embodiment of the present disclosure.

Figure 5:
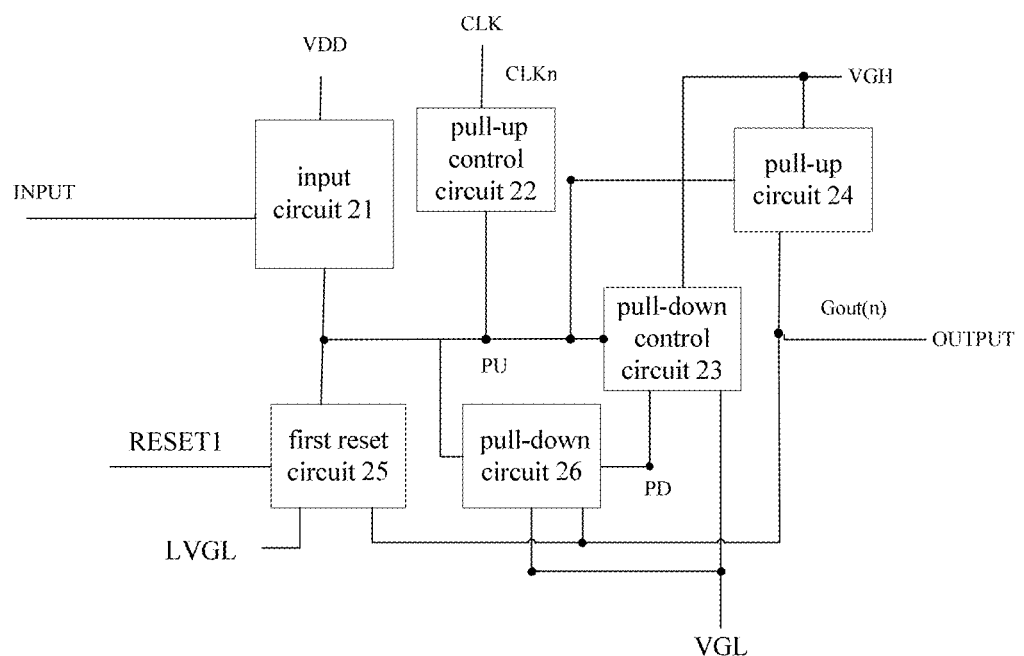
FIG. 5 is a schematic block diagram of a shift register unit according to an embodiment of the present disclosure.

FIG. 5 is a schematic block diagram of the n-th stage of shift register unit $S_n$ of the shift register 1 according to an embodiment of the present disclosure.

As shown in FIG. 5, the shift register unit $S_n$ comprises an input circuit 21, a pull-up control circuit 22, a pull-up circuit 24, and a first reset circuit 25. Herein, structures of the input circuit 21, the pull-up control circuit 22 and the pull-up circuit 24 are the same as those as shown in FIGS. 3 and 4, and thus no further details are given herein.

A first terminal of the first reset circuit 25 is connected to a first reset terminal RESET1, a second terminal of the first reset circuit is connected to the pull-up node PU, a third terminal of the first reset circuit is connected to a third signal terminal LVGL, and a fourth terminal of the first reset circuit is connected to the output terminal OUTPUT. The first reset circuit 25 is configured to reset the potentials of the pull-up node PU and the output terminal OUTPUT under the control of the signal input by the first reset terminal RESET1. Herein, the third signal terminal LVGL is input a second low level signal.

For the shift register unit $S_n$ as shown in FIG. 5, if the signal input by the first reset terminal Reset is an output signal of a (n+1)-th stage of shift register, then the shift register unit would fail to operate normally.

Figure 6:
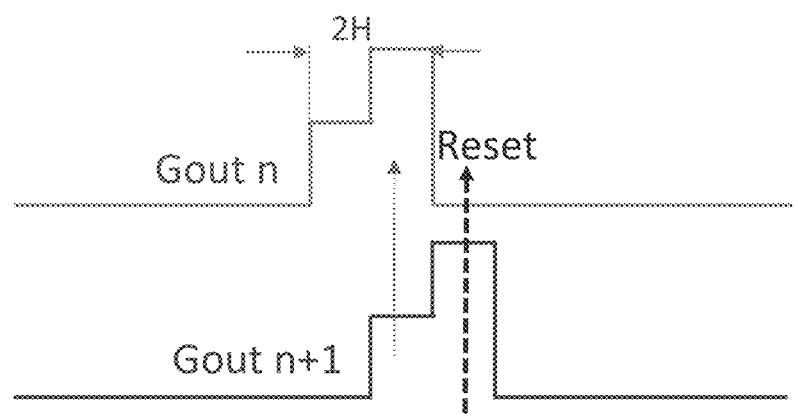
FIG. 6 shows a timing diagram of taking an output signal of an (n+1)-th stage of shift register as a reset signal of an n-th stage of shift register.

For example, FIG. 6 shows a timing diagram of taking the output signal of the (n+1)-th stage of shift register as the reset signal of the n-th stage of shift register.

As shown in FIG. 6, in the shift register unit according to the embodiment of the present disclosure, if the n-th stage of shift register utilizes the output signal Gout(n+1) of the next stage of shift register unit as a reset signal, then the reset signal would be input when the output of the present stage of shift register unit is not completed, and the shift register would not operate normally.

Therefore, in the shift register according to the embodiment of the present disclosure, for the n-th stage of shift register unit, an output signal of a (n+2)-th stage of shift register unit can be used as the reset signal.

Figure 7:
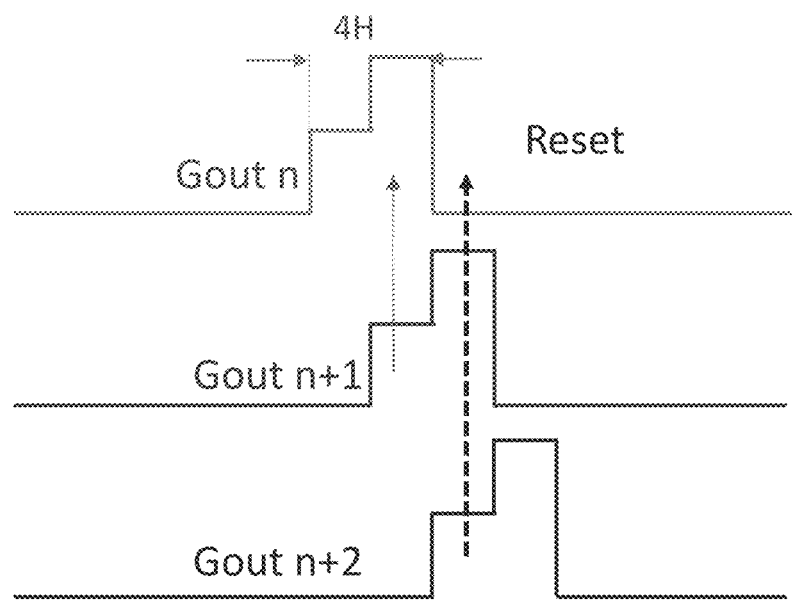
FIG. 7 is a sequence diagram representing a reset signal of a shift register unit according to an embodiment of the present disclosure.

FIG. 7 represents a sequence diagram of a reset signal of the shift register unit according to an embodiment of the present disclosure. As described in FIG. 7, if the output signal Gout(n+1) of the next stage of shift register unit $S_{n+1}$ is used as a first reset signal, then the output signal Gout(n) of the present stage of shift register unit $S_n$ does not reach a high level completely while the reset signal has started to be input, such that the shift register unit $S_n$ cannot reach a high level completely, thereby causing the problem that the shift register unit cannot be charged.

Therefore, the shift register unit according to the embodiment of the present disclosure does not utilize the output signal Gout(n+1) of the next stage of shift register unit $S_{n+1}$ as a first reset signal, but utilize the output signal Gout(n+2) of the next of next stage of shift register unit $S_{n+2}$ as the first reset signal. As shown in FIG. 7, when the output signal Gout(n+2) of the next of next stage of shift register unit $S_{n+2}$ is input as the reset signal, the present stage of shift register unit $S_n$ has already reached a high level completely, and thus the problem of failing to be charged would not occur. It is capable of solving the technical problem of being reset when the input of the shift register unit does not occur.

The n-th stage of shift register unit $S_n$ according to the embodiment of the present disclosure will described continuously by referring to FIG. 5.

As shown in FIG. 5, the n-th stage of shift register unit $S_n$ can further comprise a pull-down control circuit 23 and a pull-down circuit 26. Herein, a first terminal of the pull-down control circuit 23 is connected to the first signal terminal VGH, a second terminal of the pull-down control circuit 23 is connected to the pull-up node PU, a third terminal of the pull-down control circuit 23 is connected to the second signal terminal VGL, and a fourth terminal of the pull-down control circuit 23 is connected to the pull-down node PD. The pull-down control circuit 23 is configured to control the potential of the pull-down node PD under the control of the potential of the pull-up node PU. Herein, the second signal terminal VGL is input the first low level signal.

The first terminal of the pull-down circuit 26 is connected to the pull-up node PU, a second terminal of the pull-down circuit 26 is connected to the second signal terminal VGL, a third terminal of the pull-down circuit 26 is connected to the pull-down node PD, and a fourth terminal of the pull-down circuit 26 is connected to the output terminal OUTPUT. The pull-down circuit 26 is configured to pull down the potentials of the pull-down node PU and the output signal Gout(n) of the output terminal OUTPUT to the low level under the control of the potential of the pull-down node PD.

In the shift register unit of the circuit structure as described in FIG. 4, in the input phase, the input signal input by the input terminal INPUT is at a high level. Under the effect of the input signal, the input circuit 21 is turned on, so that the power supply signal VDD input by the power supply terminal is input to the pull-up node PU, to make the potential of the pull-up node PU becomes VDD. At this time, the pull-up circuit 24 is partially turned on under the effect of the potential VDD of the pull-up node, so that the output signal Gout(n) output by the output terminal OUTPUT rises. However, the pull-up circuit 24 is not completely turned on at this time, the output signal Gout(n) is lower than the high level signal VGH input by the first signal input terminal. The pull-down control circuit 23 controls the potential of the pull-down node PD to be decreased under the effect of the potential of the pull-up node PD and the high level input by the first signal input terminal. The pull-down circuit 26 is turned off under the control of the pull-down node PD, so that the potentials of the pull-up node PU and the output terminal OUTPUT would not be affected.

In the pull-up phase, the pull-up control circuit 22 further pulls up the potential of the pull-up node PU under the effect of the first clock signal CLKn of the first clock signal terminal CLK, the pull-up circuit 24 is turned on completely, and the output signal Gout(n) output by the output terminal OUTPUT becomes the first signal VGH input by the high level input terminal. At this time, the pull-down control circuit 23 further pulls down the potential of the pull-down node PD.

In the reset phase, the first reset signal input by the first reset terminal RESET1 becomes a high level, and thus the first reset circuit 25 is turned on, so that the potential of the pull-up node changes from a high level into a low level. At this time, under the effect of the low level of the pull-up node PU, the pull-down control circuit 23 controls the potential of the pull-down node PD to become a high level, so that the pull-down circuit 26 is turned on. The pull-down circuit 26 makes the potential of the pull-up node PU and the output signal Gout(n) of the output terminal OUTPUT maintain at a low level.

Figure 8:
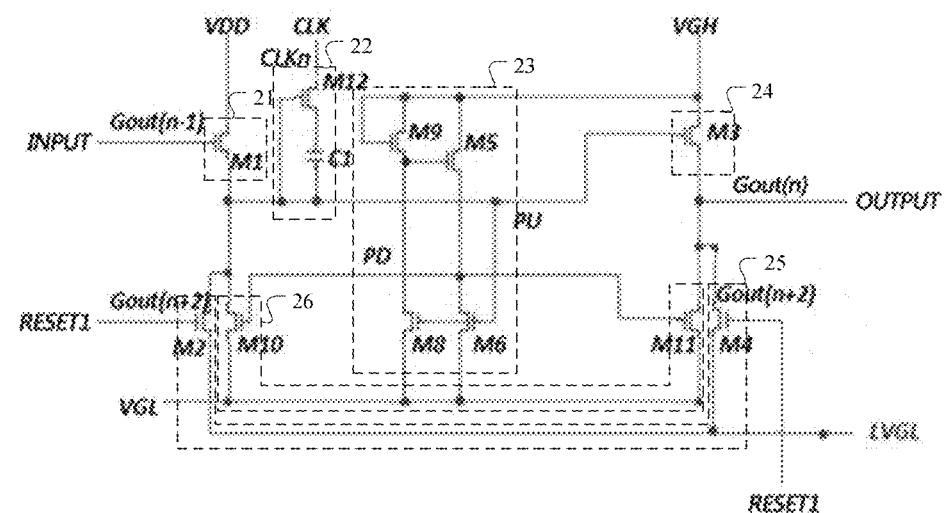
FIG. 8 is a circuit structure diagram of a shift register unit according to an embodiment of the present disclosure.

FIG. 8 is a circuit structure diagram of a shift register unit $S_n$ according to the embodiment of the present disclosure. Herein, structures of the input circuit 21, the pull-up control circuit 22 and the pull-up circuit 24 are the same as those as shown in FIGS. 3 and 4, thus no further details are given herein.

As shown in FIG. 8, the first reset circuit 25 comprises:
a first reset transistor M2, whose gate is connected to the first reset terminal Reset 1, first electrode is connected to the pull-up node PU, and second electrode is connected to the third signal terminal LVGL;
a second reset transistor M4, whose gate is connected to the first reset terminal Reset 1, first electrode is connected to the output terminal OUTPUT, and second electrode is connected to the third signal terminal LVGL.

The pull-down control circuit 23 comprises:
a first pull-down control transistor M5, whose first electrode is connected to the first signal terminal VGH, and second electrode is connected to the pull-down node PD;
a second pull-down control transistor M6, whose gate is connected to the pull-up node PU, first electrode is connected to the pull-down node PD, and second electrode is connected to the second signal terminal VGL;
a third pull-down control transistor M8, whose gate is connected to the pull-up node PU, first electrode is connected to the gate of the first pull-down control transistor M5, and second electrode is connected to the second signal terminal VGL;
a fourth pull-down control transistor M9, whose gate and first electrode are connected to the first signal terminal VGH and second electrode is connected to the gate of the first pull-down control transistor M5.

The pull-down circuit 26 comprises:
a first pull-down transistor M10, whose gate is connected to the pull-down node PD, first electrode is connected to the pull-up node PU, and second electrode is connected to the second signal terminal VGL; and
a second pull-down transistor M11, whose gate is connected to the pull-down node PD, first electrode is connected to the output terminal OUTPUT, and second electrode is connected to the second signal terminal VGL.

In the input phase, the input signal Gout(n−1) is at a high level, thereby causing the input transistor M1 of the input circuit 21 to be turned on. Therefore, the potential of the pull-up node PU becomes a high level under the effect of the power supply voltage VDD, and controls to make the pull-up transistor M3 of the pull-up circuit 24 be partially in a turn-on state, and the output signal Gout(n) output by the output terminal OUTPUT rises. However, at this time, the output signal Gout(n) can be lower than the high level input signal VGH of the high level input terminal. In addition, in the input phase, under the effect of the potential of the pull-up node PU and the first signal VGH of the first signal terminal, the pull-down control circuit 23 controls the potential of the pull-down node PD, to reduce the potential from the high level.

In the pull-up phase, the pull-up control circuit 22 further pulls up the potential of the pull-up node PU under the effect of the first clock signal CLKn of the first clock signal terminal CLK, and controls to make the pull-up transistor M3 of the output circuit 24 turned on completely, and the output signal Gout(n) output by the output terminal OUTPUT would also rise. At this time, under the effect of the high level of the pull-up node PU, the second pull-down control transistor M6 and the third pull-down control transistor M8 of the pull-down control circuit 23 are in a turn-on state. At this time, the potential of the pull-down node PD further becomes a low level under the effect of the second signal VGL. The first pull-down transistor M10 and the second pull-down transistor M11 of the pull-down circuit 26 are in a turn-off state under the effect of the low level of the pull-down node PD and the second signal VGL of the second signal terminal, which would not affect the potential of the pull-up node PU and the potential of the output signal Gout(n) of the output terminal OUTPUT.

In the reset phase, since the first reset signal Gout(n+2) of the first reset terminal RESET1 of the first reset circuit 25 becomes the high level, the first reset transistor M2 is turned on, thus causing that the potential of the pull-up node PU becomes the third signal LVGL, so that the pull-up transistor M3 of the pull-up circuit 24 is turned off, and the first signal VGH cannot be output from the output terminal OUTPUT. Additionally, the second reset transistor M4 of the first reset circuit 25 is turned on under the effect of the first reset signal Gout(n+2) of the first reset terminal RESET1, so that the output signal Gout(n) of the output terminal OUTPUT is reset as a low level. At this time, since the potential of the pull-up node PU is at a low level, thereby causing that the second pull-down control transistor M6 and the third pull-down control transistor M8 of the pull-down control circuit 23 are turned off, while the fourth pull-down control transistor M9 is turned on under the effect of the first signal VGH, so that the first pull-down control transistor M5 is in a turn-on stage because the gate of the pull-down control transistor M6 is input the first signal, and thus the pull-down node PD becomes a high level. Thus, the second pull-down transistor M11 and the first pull-down transistor M10 of the pull-down circuit 26 are turned on, so that the pull-up node PU and the output signal Gout(n) of the output terminal OUTPUT maintain at a low level.

It shall be noted that the second signal VGL and the third signal LVGL according to the present disclosure may be the same, or may be different.

In the present disclosure, since the first reset signal of the first reset terminal RESET1 utilizes the output signal Gout (n+2) of the (n+1)-th stage of shift register unit $S_{n+2}$ instead of using the output signal Gout(n+1) of the next stage of shift register unit $S_{n+1}$, it is capable of making the shift register unit operate normally as shown in FIG. 7.

Figure 9A:
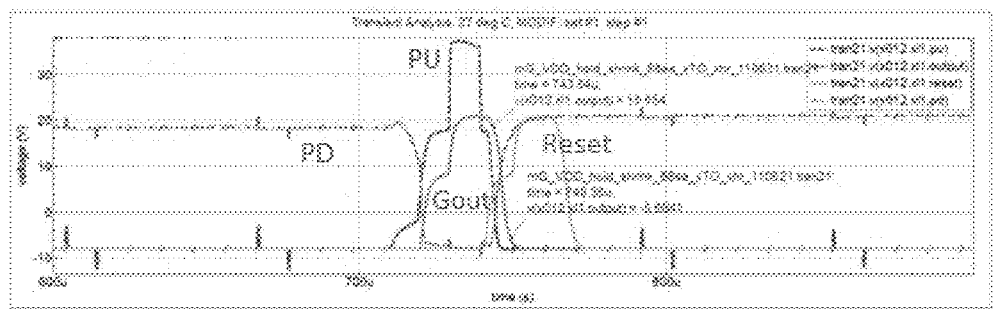
FIG. 9A shows an output signal of a shift register unit according to an embodiment of the present disclosure.
Figure 9B:
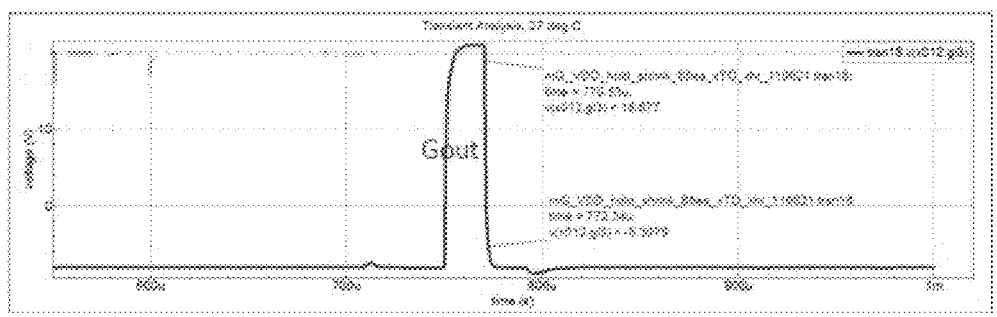
FIG. 9B shows an output signal of a shift register unit according to the prior art.

FIG. 9A shows an output signal of the shift register unit according to the embodiment of the present disclosure. FIG. 9B shows an output signal of a shift register unit according to the prior art. As shown in FIG. 8A, the shift register unit according to the present disclosure utilizes the Gout(n+2) as the reset signal, and thus the reset signal starts to rise and functions as resetting at a moment when the signal Gout achieves the high level completely. In addition, compared with the output signal of the existing GOA, the power consumption of the GOA of the present disclosure reduces about 15-20%, so that the effect of low power consumption is realized.

Figure 10:
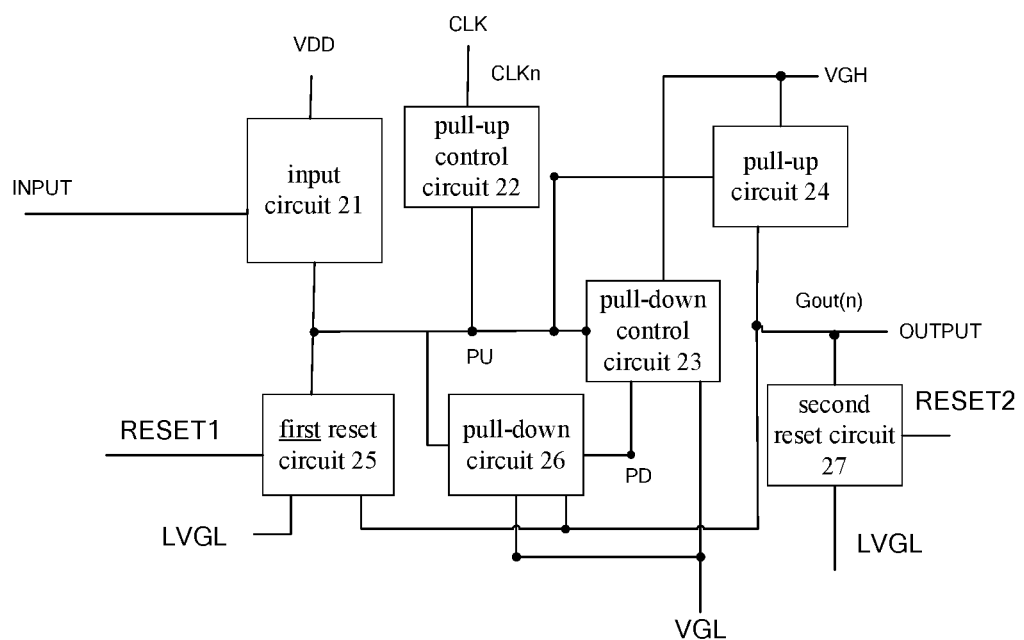
FIG. 10 shows a schematic block diagram of a shift register unit according to an embodiment of the present disclosure.

FIG. 10 shows a schematic block diagram of a shift register unit according to an embodiment of the present disclosure.

The shift register unit as shown in FIG. 10 comprises an input circuit 21, a pull-up control circuit 22, a pull-down control circuit 23, a pull-up circuit 24, a first reset circuit 25, a pull-down circuit 26 and a second reset circuit 27. Herein, the input circuit 21, the pull-up control circuit 22, the pull-down control circuit 23, the pull-up circuit 24, the first reset circuit 25, and the pull-down circuit 26 are the same as those as shown in FIGS. 5 and 8, and thus no further details are given herein.

As shown in FIG. 10, a first terminal of the second reset circuit 27 is connected to the output terminal OUTPUT, a second terminal of the second reset circuit is connected to the third signal terminal LVGL, and a third terminal of the second reset circuit is connected to the second reset terminal RESET2.

Herein, a pulse of a second reset signal input by the second reset terminal RESET2 is later by one clock unit than a pulse of the first clock signal CLKn input by the first clock signal terminal CLK. The second reset signal can be a first clock signal CLKn+1 input by the first clock signal terminal CLK of the next stage of shift register unit $S_{n+1}$. In the reset phase, the clock signal CLKn+1 is at a high level, and thus the reset transistor M4C would be turned on immediately, thereby causing that the output signal Gout(n) output by the output terminal OUTPUT is reduced immediately and becomes a low level. Therefore, it is capable of functioning as shortening the falling time of the output signal.

Figure 11:
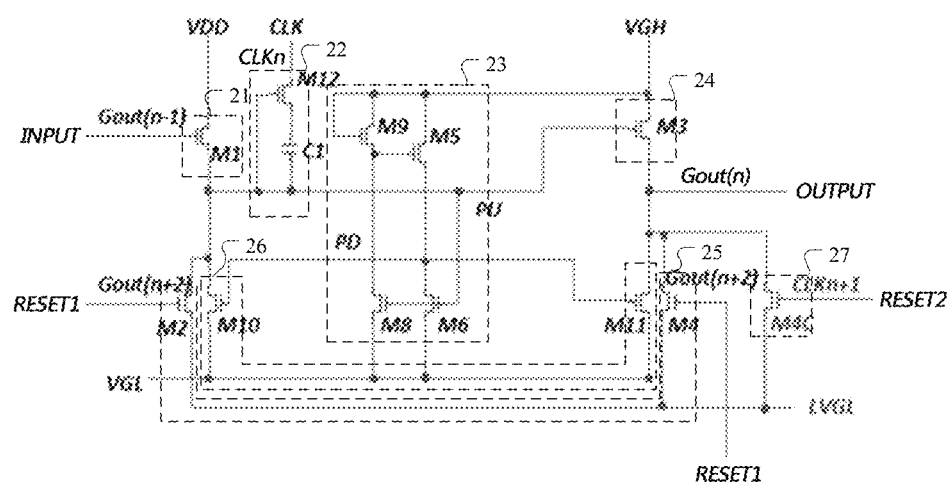
FIG. 11 is a circuit structure diagram of a shift register unit according to an embodiment of the present disclosure.

FIG. 11 is a circuit structure diagram of a shift register unit according to an embodiment of the present disclosure.

As shown in FIG. 11, on the basis of the circuit diagram of the shift register unit of FIG. 5, the shift register unit further comprises a second reset circuit 27.

The second reset circuit 27 comprises an output reset transistor M4C, whose gate is connected to the second reset terminal RESET2, first electrode is connected to the output terminal OUTPUT, and second electrode is connected to the third signal terminal LVGL.

Herein, the pulse of the second reset signal input by the second reset terminal RESET2 is later by one clock unit than the pulse of the first clock signal CLKn input by the first clock signal terminal CLK. The second reset signal can be the first clock signal CLKn+1 input by the first clock signal terminal CLK of the next stage of shift register unit $S_{n+1}$.

Thus, in the reset phase, since the second reset terminal RESET2 is input the first clock signal CLKn+1 of the next stage, while the first clock signal CLKn+1 is at a high level at this time. Therefore, the reset transistor M4C would be turned on immediately, which causes that the output signal Gout(n) output by the output terminal OUTPUT is reduced immediately and becomes a low level. Therefore, it is capable of functioning as shortening the falling time of the output signal.

Additionally, the third signal LVGL input by the third signal terminal can be lower than the second signal VGL input by the second signal terminal.

Thus, by utilizing the second reset signal CLKn+1 and the third signal LVGL lower than the second signal VGL, it is capable of accelerating the falling speed of the output signal Gout(n).

Figure 12:
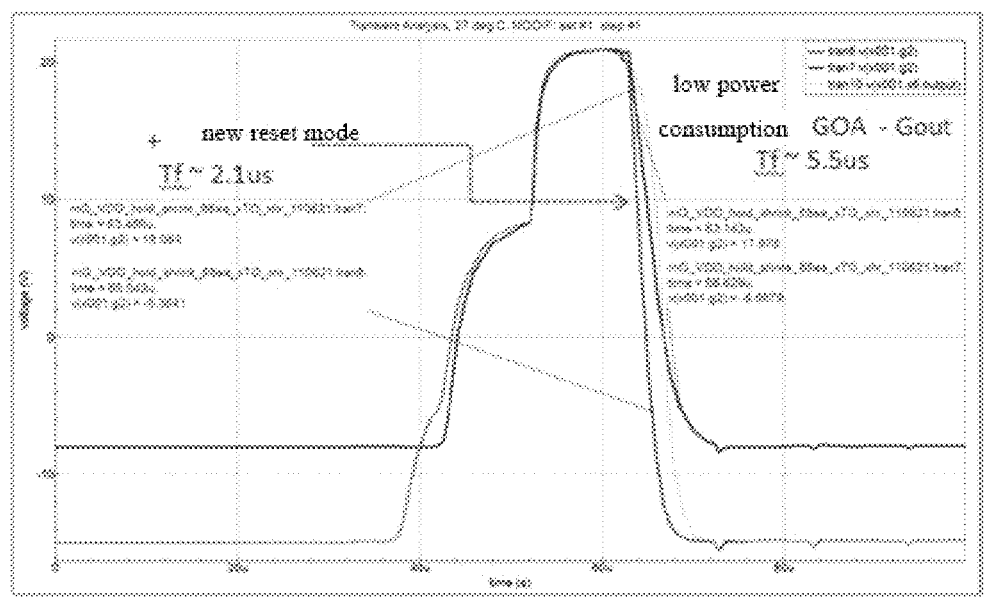
FIG. 12 is an effect drawing of shortening a falling time in the case of utilizing a second reset signal CLKn+1 and a third signal LVGL.

FIG. 12 is an effect diagram of shortening the falling time in the case of utilizing the second reset signal CLKn+1 and the third signal LVGL. As shown in FIG. 12, when the second reset signal CLKn+1 and the third signal LVGL are utilized, the falling time is shortened from 5.5 us to 2.1 us, so that the problem of the charging rate caused by the increase of the falling time is obviously improved.

Figure 13:
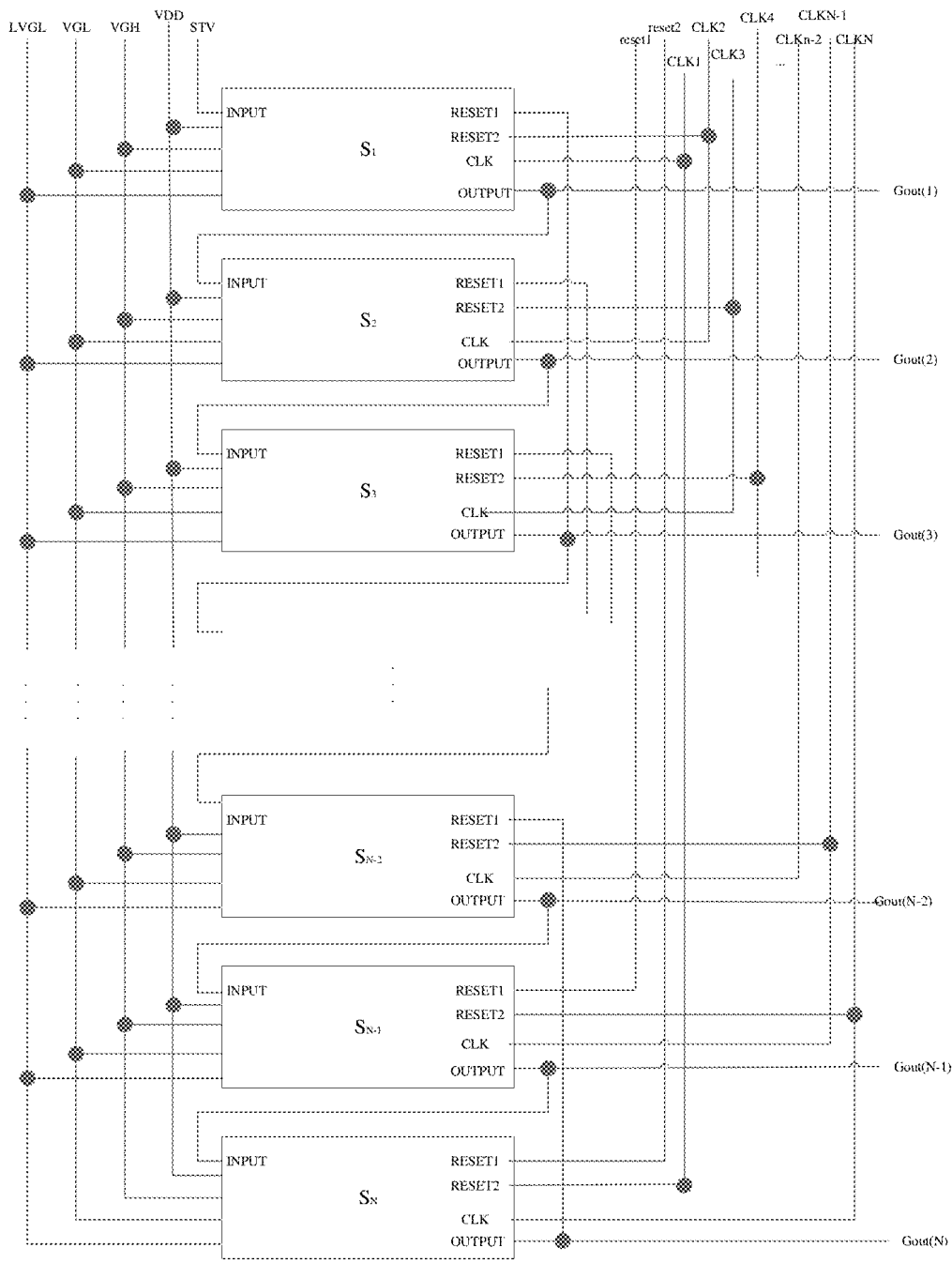
FIG. 13 represents a circuit diagram of a gate driving circuit comprising shift register units $S_1, \ldots, S_N$ connected in cascades.
Figure 14:
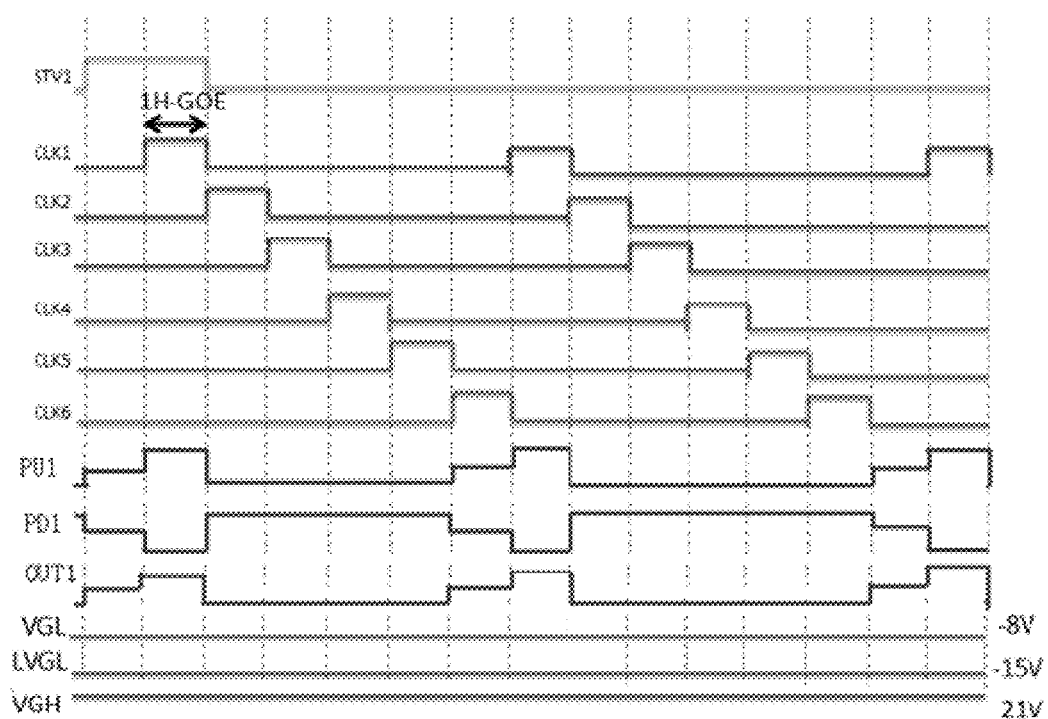
FIG. 14 is timing diagram of a shift register.

FIG. 13 represents a circuit diagram of a gate driving circuit comprises shift register units $S_1, \ldots, S_N$ connected in cascades. FIG. 14 represents a signal sequence diagram of the gate driving circuit. As shown in FIG. 13, an input terminal INPUT of a first stage of shift register unit $S_1$ is input a start signal STV, a first reset terminal RESET1 of a second stage of shift register unit from the bottom $S_{N-1}$ is input a first reset signal reset1, the first reset terminal RESET1 of the last stage of shift register unit $S_N$ is input a second reset signal reset2, and a second reset terminal RESET2 of the last stage of shift register unit $S_N$ is input the first clock signal of the first stage of shift register unit $S_1$.

Figure 15:
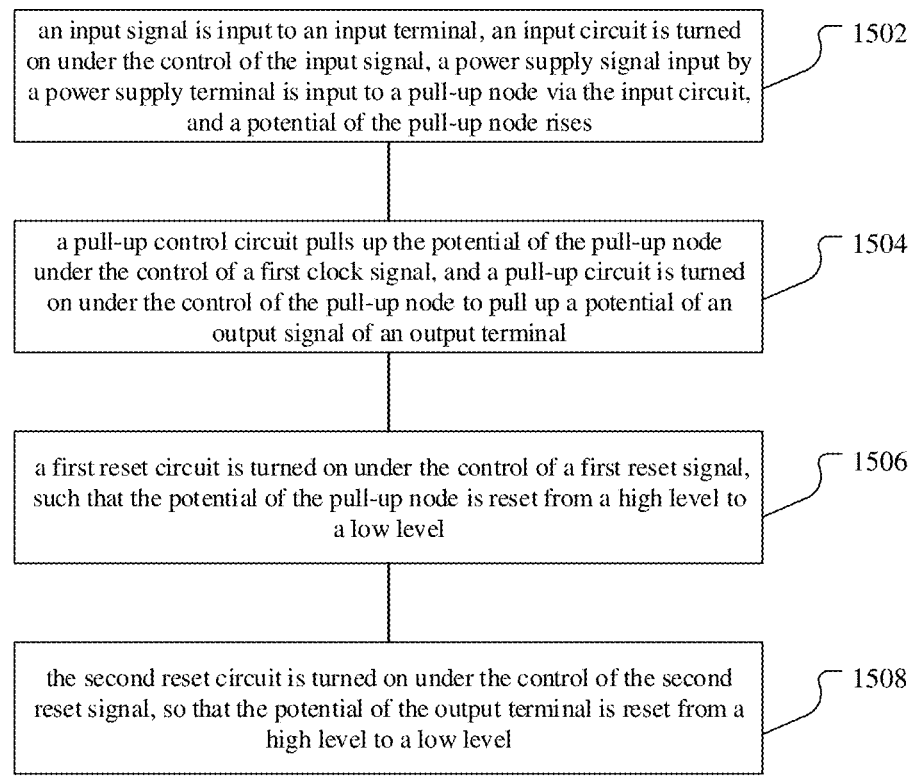
FIG. 15 is a flow diagram of a driving method applicable to a shift register unit according to an embodiment of the present disclosure.

FIG. 15 shows a gate driving method applicable to the gate driving circuit as described above according to an embodiment of the present disclosure. As shown in FIG. 15, in step 1502, the input signal is input to the input terminal, the input circuit is turned on under the control of the input signal, the power supply signal input by the power supply terminal is input to the pull-up node via the input circuit, and the potential of the pull-up node rises. In the first shift register unit $S_1$ of the gate driving circuit, in the input phase, when the input terminal INPUT is input a start signal STV1, the input transistor M1 of the input circuit 21 is turned on, such that the potential of the pull-up node PU rises under the effect of the power supply voltage VDD, and thus the pull-up transistor M3 of the pull-up circuit 24 is also partially turned on, so that the output signal Gout(1) output by the output terminal OUTPUT rises from a low level under the effect of the first signal VGH, but it does not rise to the first signal VGH being at a high level completely. At this time, under the effect of the pull-up node PU, the second pull-down control transistor M6 and the third pull-down control transistor M8 of the pull-down control circuit 23 are partially turned on, thereby causing that the potential of the pull-down node PD is reduced under the effect of the second signal VGL. Therefore, the first pull-down transistor M10 and the second pull-down transistor M11 of the pull-down circuit 26 are turned off, which would not affect the potential of the pull-up node PU and the potential of the output signal Gout(1) of the output terminal OUTPUT.

In step 1504, the pull-up control circuit pulls up the potential of the pull-up node under the control of the first clock signal, and the pull-up circuit is turned on under the control of the pull-up node to pull up the potential of the output signal of the output terminal. In the pull-up phase, under the effect of the pull-up control circuit 22, the potential of the pull-up node PU is further pulled up, so that the pull-up transistor M3 of the pull-up circuit 24 is completely turned on, and the output signal Gout(1) output by the output terminal becomes a high level under the effect of the first signal VGH. At this time, under the effect of the level of the pull-up node PU, the second pull-down control transistor M6 and the third pull-down control transistor M8 of the pull-down control circuit 23 are completely turned on, so that the potential of the pull-down node PD is further reduced. Thus, the first pull-down transistor M10 and the second pull-down transistor M11 are in a turn-off state, which would not affect the potential of the pull-up node PU and the potential of the output signal Gout(1) of the output terminal OUTPUT.

In step 1506, the first reset circuit is turned on under the control of the first reset signal, so that the potential of the pull-up node is reset from a high level to a low level. In the first reset phase, the first reset signal Gout(3) of the first reset terminal RESET1 rises, there causing that the first reset transistor M2 of the first reset circuit 25 is turned on, so that the potential of the pull-up node PU decreases, the pull-up transistor M3 is turned off, and the high level VGH cannot be output from the output terminal OUTPUT. Additionally, the second reset transistor M4 of the first reset circuit 25 resets the output signal Gout(1) of the output terminal OUTPUT under the effect of the first reset signal Gout(3). At this time, the potential of the pull-up node PU1 decreases, and thus the second pull-down control transistor M6 and the third pull-down transistor M8 of the pull-down control circuit 23 are turned off, and the fourth pull-down control transistor M9 is turned on under the effect of the first signal VGH, so that the first pull-down control transistor M5 is in a turn-on stage because the gate of the first pull-down control transistor M5 is input a high level signal, and thus the potential of the pull-down node PD1 becomes a high level. As a result, the first pull-down transistor M10 and the second pull-down transistor M11 of the pull-down circuit 26 are turned on, to make the potential of the pull-up node PU1 and the potential of the output terminal pulled down and maintain at a low level.

In step 1508, the second reset circuit is turned on under the control of the second reset signal, so that the potential of the output terminal is reset from a high level to a low level. In the second reset phase, the pulse of the second reset signal input by the second reset terminal RESET2 is later one clock unit than the pulse of the first clock signal input by the first clock signal terminal CLK. In this phase, the clock signal CLKn+1 is at a high level, and thereby the reset transistor M4C would be immediately turned on, which causes that the output signal output by the output terminal OUTPUT is immediately reduced and becomes a low level. Therefore, it is capable of functioning as shortening the falling time of the output signal.

It can be conceived that the step 1508 in the above method is optional. For example, according to the structure of the shift register unit as described above, if the shift register unit does not include the second reset circuit, then the gate driving method 1500 may not comprise the step 1508.

Additionally, based on a same concept, there is provided in an embodiment of the present disclosure a display apparatus, comprising an array substrate and a gate driving circuit on the array substrate. A signal output terminal of each shift register unit of the gate driving circuit is connected to a gate line of a gate line signal of the array substrate which is controlled by the gate integrated driving circuit.

Since the display apparatus provided in the embodiment adopts the gate driving circuit of the present disclosure, it is capable of realizing low power consumption, and thus would not cause the problem that the shift register unit fails to be charged, and is further capable of shortening the falling time of the gate driving signal.

The display apparatus can be any product or means having the function of displaying such as a liquid crustal panel, an electronic paper, an OLED panel, a mobile phone, a table computer, a television set, a display, a notebook computer, a digital photo frame, a navigator, etc.

Through the above description, it can be seen that the gate integrated driving circuit, the shift register unit and the display screen provided in the embodiment of the present disclosure are capable of eliminating the problem of starting resetting when the output signal fails to be output sufficiently by utilizing the input of the next of next stage of gate integrated driving circuit as a reset signal, and are capable of shortening the falling time of the output signal of the shift register unit by utilizing the second reset signal and the third signal lower than the second signal.

The above embodiments are just used for describing the principles of the present disclosure, but are not used for limiting. Those skilled in the art can make various variations and modifications without departing from the spirit and scope of the present disclosure. Therefore, all equivalent technical solutions also fall into the scope of the present disclosure.

What is claimed is:

1. A shift register unit, comprising:
   an input circuit, whose first terminal is connected to a power supply terminal, second terminal is connected to an input terminal, third terminal is connected to a pull-up node, the input circuit being configured to input a power supply signal input by the power supply terminal to the pull-up node under the control of an input signal;

a pull-up control circuit, whose first terminal is connected to a first clock signal terminal, second terminal is connected to the pull-up node, the pull-up control circuit being configured to control a potential of the pull-up node according to a first clock signal input by the first clock signal terminal;

a pull-up circuit, whose first terminal is connected to a first signal terminal, second terminal is connected to an output terminal, and third terminal is connected to the pull-up node, the pull-up circuit being configured to pull up a potential of an output signal output by the output terminal under the control of the pull-up node;

a pull-down control circuit, whose first terminal is connected to the first signal terminal, second terminal is connected to the pull-up node, third terminal is connected to the pull-down node, and fourth terminal is connected to a second signal terminal, the pull-down control circuit being configured to control a potential of the pull-down node under the control of the potential of the pull-up node;

a pull-down circuit, whose first terminal is connected to the pull-up node, second terminal is connected to the second signal terminal, third terminal is connected to the pull-down node, and fourth terminal is connected to the output terminal, the pull-down circuit being configured to pull down the potentials of the pull-up node and the output terminal under the control of the potential of the pull-down node.

2. The shift register unit according to claim 1, further comprising:

a first reset circuit, whose first terminal is connected to the pull-up node, second terminal is connected to a first reset terminal, third terminal is connected to a third signal terminal, and fourth terminal is connected to the output terminal, the first reset circuit being configured to reset potentials of the pull-up node and the output terminal under the control of a first reset signal input by the first reset terminal.

3. The shift register unit according to claim 2, wherein a plurality of the shift register units are connected cascaded as a plurality of stages of shift register units, wherein a first reset signal of an n-th stage of the shift register unit is an output signal of a (n+2)-th stage of shift register unit, where n is an integer greater than 0.

4. The shift register unit according to claim 2, wherein the first reset circuit comprises:

a first reset transistor, whose gate is connected to the first reset terminal, first electrode is connected to the pull-up node, and second electrode is connected to the third signal terminal; and a second reset transistor, whose gate is connected to the first reset terminal, first electrode is connected to the output terminal, and second electrode is connected to the third signal terminal.

5. The shift register unit according to claim 2, wherein, the second signal terminal is input a first low level signal; the third signal terminal is input a second low level signal.

6. The shift register unit according to claim 5, wherein, the second low level signal is lower than the first low level signal.

7. The shift register unit according to claim 1, further comprising:

a second reset circuit, whose first terminal is connected to the output terminal, second terminal is connected to a second reset terminal, and third terminal is connected to the third signal terminal, the second reset circuit being configured to reset the potential of the output terminal under the control of a second reset signal input by the second reset terminal.

8. The shift register unit according to claim 7, wherein the second reset circuit comprises:

an output reset transistor, whose gate is connected to the second reset terminal, first electrode is connected to the output terminal, and second electrode is connected to the third signal terminal.

9. The shift register unit according to claim 8, wherein the second reset signal is a signal later by one clock unit than a first clock signal.

10. The shift register unit according to claim 1, wherein the input circuit comprises:

an input transistor, whose gate is connected to the input terminal which is input by the input signal, first electrode is connected to the power supply terminal which is input by the power supply signal, and second electrode is connected to the pull-up node.

11. The shift register unit according to claim 1, wherein the pull-up control circuit comprises:

a pull-up control transistor, whose gate is connected to the pull-up node, first electrode is connected to the first clock signal terminal; and a pull-up control capacitor, whose one terminal is connected to a second electrode of the pull-up control transistor, and another terminal is connected to the pull-up node.

12. The shift register unit according to claim 11, wherein said another terminal of the pull-up control capacitor is directly connected to the pull-up node.

13. The shift register unit according to claim 1, wherein the pull-up circuit comprises:

a pull-up transistor, whose gate is connected to the pull-up node, first electrode is connected to the first signal terminal, and second electrode is connected to the output terminal.

14. The shift register unit according to claim 1, wherein the pull-down control circuit comprises:

a first pull-down control transistor, whose first electrode is connected to the first signal terminal, and second electrode is connected to the pull-down node;

a second pull-down control transistor, whose gate is connected to the pull-up node, first electrode is connected to the pull-down node, and second electrode is connected to the second signal terminal;

a third pull-down control transistor, whose gate is connected to the pull-up node, first electrode is connected to a gate of the first pull-down control transistor, and second electrode is connected to the second signal terminal;

a fourth pull-down control transistor, whose gate and first electrode are connected to the first signal terminal, and second electrode is connected to the gate of the first pull-down control transistor.

15. The shift register unit according to claim 1, wherein the pull-down circuit comprises:

a first pull-down transistor, whose gate is connected to the pull-down node, first electrode is connected to the pull-up node, and second electrode is connected to the second signal terminal; and a second pull-down transistor, whose gate is connected to the pull-down node, and first electrode is connected to the output terminal, and second electrode is connected to the second signal terminal.

16. The shift register unit according to claim 1, wherein, the second signal terminal is input a first low level signal.

17. The shift register unit according to claim 1, wherein, the first signal terminal is input by a high level signal.

18. A gate driving circuit, comprising a plurality of shift register units according to claim 1 connected in cascades, wherein
- an input terminal of a first stage of shift register unit is connected to a start signal, a first reset terminal of a second stage of shift register unit from the bottom is connected to a first reset signal, a first reset terminal of a last stage of shift register unit is connected to a second reset signal, and a second reset terminal of the last stage of shift register unit is connected to a first clock signal of the first stage of shift register unit,
- for each stage of shift register unit from the first stage of shift register unit to a third stage of shift register unit from the bottom, the first reset terminal of the stage of shift register unit is input by the output signal of its next stage of shift register unit.

19. A display, comprising an array substrate and the gate driving circuit according to claim 18 on the array substrate,
- a signal output terminal of the shift register is connected to a gate of the array substrate.

20. A gate driving method applicable to the gate driving circuit according to claim 18, comprising:
- in an input phase, the input signal is input to an input terminal, an input circuit is turned on under the control of the input signal, a power supply signal input by a power supply terminal is input to a pull-up node via the input circuit, and a potential of the pull-up node rises;
- in a pull-up phase, the pull-up control circuit pulls up the potential of the pull-up node under the control of a first clock signal, and a pull-up circuit is turned on under the control of the pull-up node to pull up a potential of an output signal of an output terminal.

* * * * *